United States Patent
Tsironis

(10) Patent No.: US 10,451,702 B1
(45) Date of Patent: Oct. 22, 2019

(54) CALIBRATION METHOD FOR HIGH GAMMA COMBO TUNER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 220 days.

(21) Appl. No.: 15/341,662

(22) Filed: Nov. 2, 2016

Related U.S. Application Data

(62) Division of application No. 15/298,268, filed on Oct. 20, 2016, now abandoned.

(60) Provisional application No. 62/245,011, filed on Oct. 22, 2015.

(51) Int. Cl.
| | | |
|---|---|---|
| G01R 35/00 | (2006.01) | |
| G01R 27/28 | (2006.01) | |
| G08B 29/20 | (2006.01) | |
| G01R 33/00 | (2006.01) | |
| G01R 31/319 | (2006.01) | |

(52) U.S. Cl.
CPC .......... G01R 35/005 (2013.01); G01R 27/28 (2013.01); G08B 29/20 (2013.01); G01R 31/3191 (2013.01); G01R 33/0023 (2013.01)

(58) Field of Classification Search
CPC .. G01R 35/00; G01R 35/005; G01R 31/3191; G01R 33/00; G01R 33/0017; G01R 33/0023; G01R 27/00; G01R 27/28; G08B 29/20
USPC ............ 324/600, 601, 202, 750.02, 74, 130; 702/85
See application file for complete search history.

(56) References Cited

U.S. PATENT DOCUMENTS

| | | | | |
|---|---|---|---|---|
| 5,034,708 A | | 7/1991 | Adamian et al. | |
| 8,912,861 B1 * | | 12/2014 | Tsironis | H01G 5/06 333/17.3 |
| 9,344,061 B1 * | | 5/2016 | Tsironis | H03H 7/40 |
| 9,614,693 B2 * | | 4/2017 | Simpson | H04L 25/0278 |
| 9,625,556 B1 * | | 4/2017 | Tsironis | G01R 35/00 |
| 9,647,629 B1 * | | 5/2017 | Tsironis | H03H 7/38 |

OTHER PUBLICATIONS

Load Pull System: http://www.microwaves101.com/encyclopedia/loadpull.cfm.
"Computer Controlled Microwave Tuner—CCMT", Product Note 41, Focus Microwaves, Jan. 1998.
Transmission parameters: http://en.wikipedia.org/wiki/T_parameters.
PIN Diode: https://en.wikipedia.org/wiki/PIN_diode.
MOSFET: https://en.wikipedia.org/wiki/MOSFET.

* cited by examiner

*Primary Examiner* — Hoai-An D. Nguyen

(57) ABSTRACT

An RF electronic impedance tuner uses multiple PIN diodes, Varactors or MOSFETs, mounted in a low loss slab-line, between the bottom surface of the center conductor and ground, are DC controlled individually and spaced appropriately along the slab-line in order to generate maximum Gamma and bandwidth. The electronic tuner is combined with a slide screw tuner, using the same slab-line in various configurations, before, after or sharing the same slab-line section, mounted on top of each-other. Calibration on a VNA allows high Gamma and harmonic tuning.

2 Claims, 25 Drawing Sheets

CALIBRATION METHOD FOR HIGH GAMMA COMBO TUNER

PRIORITY CLAIM

This application is a divisional application to Ser. No. 15/298,286, filed on Oct. 20, 2016, titled "High Gamma Electronic Tuner" which claims priority on provisional application 62/245,011, filed on Oct. 22, 2015, which is hereby enclosed in its entirety for reference purposes.

CROSS-REFERENCE TO RELATED ARTICLES

1. Load Pull System: http://www.microwaves101.com/encyclopedia/loadpull.cfm
2. "Computer Controlled Microwave Tuner—CCMT", Product Note 41, Focus Microwaves, January 1998
3. Adamian et al., U.S. Pat. No. 5,034,708, "Programmable Broadband Electronic Tuner"
4. Transmission parameters: http://en.wikipedia.org/wiki/T_parameters
5. PIN Diode: https://en.wikipedia.org/wiki/PIN_diode
6. MOSFET: https://en.wikipedia.org/wiki/MOSFET

BACKGROUND OF THE INVENTION—PRIOR ART

This invention relates to high power (nonlinear) testing of RF transistors (DUT) in the frequency and time domain (see ref. 1) using Load Pull. Load pull is the method by which the load impedance presented to the DUT at a given frequency is changed systematically and the DUT performance is registered, with the objective to find an optimum tuning condition for certain overall design objectives. This objective may be maximum power, maximum efficiency, linearity or else or a combination thereof. The same is valid for the source side of the DUT. Passive (slide screw) tuners are used to create the various impedances presented to the DUT (see ref. 2) for frequencies above 100 MHz. A typical test setup is shown in FIG. 1: a signal source (1) injects RF power into a DUT (3) via an input tuner (2) which generates the source impedance presented to the DUT. An output tuner (4) generates the load impedance. The outcoming power from tuner (4) is detected by the power meter (5). The whole is controlled by a PC (6) via digital communication with the test instruments (9) and the tuners (7), (8). Data are collected by the PC as a function of the impedances generated by the tuners and saved in load pull measurement files.

Impedance tuners are used to create the test impedances used in load and source pull testing. Some tuners use the slide-screw principle, (FIGS. 2 to 4), see ref. 2, others are using electronic components (PIN diodes, FIG. 6), see ref. 3. The basic design of a slide screw tuner comprises a low loss slotted airline (slab-line) (24, 44), 32) in which a metallic (reflective) probe (22, 41) is inserted and capacitively coupled with the center conductor (23, 34, 43). The proximity of the probe with the center conductor allows controlling the amount of reflected RF power and thus the reflection factor (which is the RF impedance generated by the tuner). Moving the probe along the axis of the slab-line (24, 45) allows controlling the phase of the reflection factor. If the horizontal movement reaches one half of the wavelength at the selected frequency, then a full circle on the Smith chart is covered and by that the whole spectrum of real (R) and imaginary (X) part of (complex) Impedances Z=R+jX can be synthesized. The only limitations of such a tuner are (a) the maximum reflection factor due to losses and limit of coupling proximity of the probe with the center conductor (galvanic contact must be avoided to avoid shorting the tuner and not being able to control the impedance) and (b) the tuning speed, since the carriage (28) which carries the probe (22) must be moved horizontally (217) and the axis (21) controlling the probe must be moved vertically (216); both those mechanical movements take time, and this slows down the tuning operations. Slide screw tuners have no further limitations, beyond the fact that they are bulky and heavy, but so is most auxiliary RF laboratory test equipment. FIG. 5 shows well distributed tuning points (50) generated using slide screw tuners over the whole Smith chart (51).

Speed and size/weight can be improved using electronic tuners (see FIG. 1 in ref. 3, replicated here as FIG. 6). In this case the adjustable reflective probe (22 in FIG. 2) is replaced by an array of electronic switches (PIN diodes, 1 to 15 in FIG. 6), distributed along a micro-strip line. By switching the diodes ON and OFF individual reflections are created and, when the diodes are placed strategically spaced along the transmission line in FIG. 6 between RF IN and RF OUT, the combination of the individual reflection factors can generate tuning patterns as shown in FIG. 7 (see ref. 3). It is obvious that the behavior of the tuning pattern of electronic tuners (FIG. 7) is inferior to the tuning pattern of slide screw tuners (FIG. 5) both in regularity of the tuned points and maximum reflection factor. The regularity and density of electronic tuner points depends on the number of diodes used, whereas the limitation in maximum reflection is due to losses associated with the micro-strip structures used in such prior art tuners (see ref. 3) and PIN diode losses.

BRIEF SUMMARY OF THE INVENTION

In this invention a hybrid solution between traditional electronic tuner based on microstrip transmission line and slide screw tuner is proposed, which allows overcoming the weaknesses of both solutions: it allows high reflection and high speed by introducing, in a first embodiment a diode, or electronic switch, array inside a low loss slotted airline and, in a second embodiment, by combining such an electronic switch array with a static pre-matching reflective probe in order to reach, depending on the configuration, either extremely high reflection factors combined with high tuning speed, or reducing residual load reflection in high volume high precision 50 Ohm production testing.

BRIEF DESCRIPTION OF THE DRAWINGS

The invention and its mode of operation will be better understood from the following detailed description when read when read with the appended drawings in which.

DETAILED DESCRIPTION OF THE INVENTION

The invention discloses a high speed, high reflection hybrid impedance tuner. The concept is shown in a number of embodiments in FIGS. 8, 9, 11, 15 to 19, 21 to 24. The basic idea is to use the low loss slotted airline (slab-line) of the slide screw tuner and implant electronic switches in form of PIN diodes (see ref. 5) or Varactors (voltage controlled adjustable capacitors) or MOSFET transistor (see ref. 6) based RF switches in the area of the center conductor which affects minimally the electric field, when the switches are in the OFF (open) state and creating a short circuit when they are in the ON (shorted) state. The use of the slab-line as transmission line allows adding to the electronic tuner a pre-matching section based on a capacitively coupled reflective probe, which allows directing and focusing the electronic tuning in a desired area of the Smith chart allowing higher GAMMA and impedance point density in this area, or using the electronic tuner to improve the residual return loss of the test system for high volume 50Ω testing. The concept is outlined in detail below.

Figure 8:
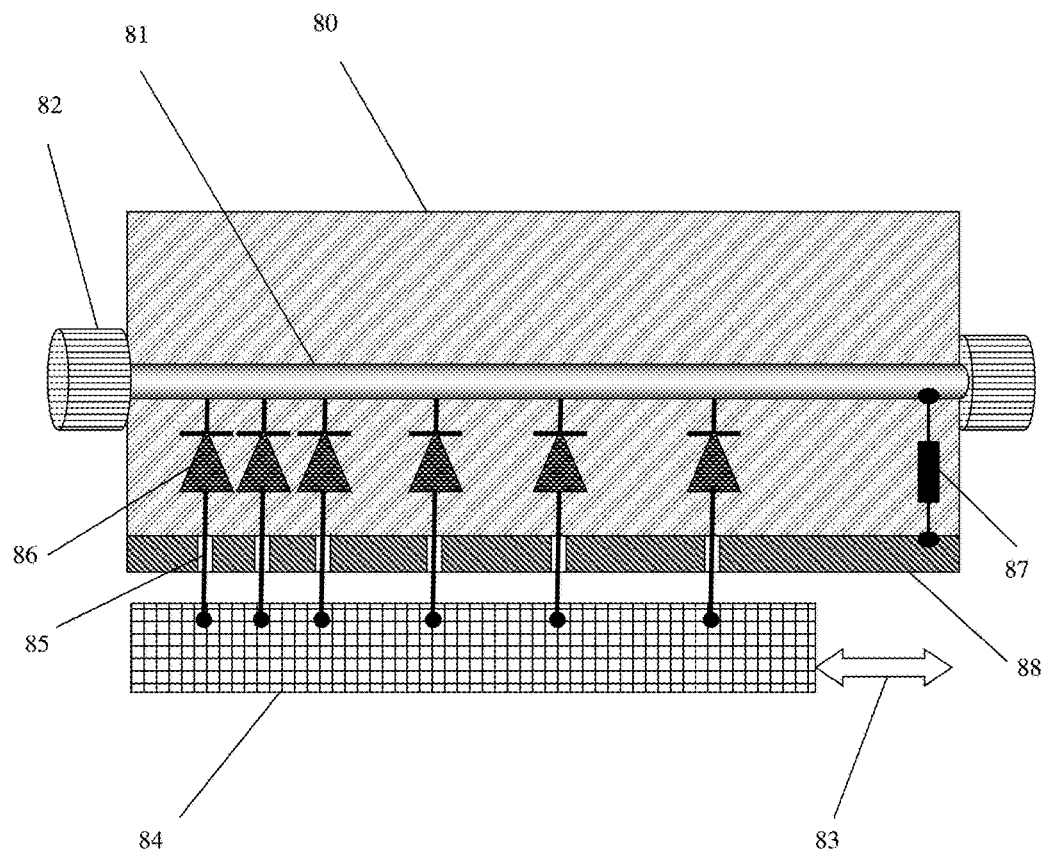
FIG. 8 depicts front view of high gamma electronic tuner—with PIN diodes mounted inside the slab-line.

FIG. 8 shows schematics of the implementation of the electronic tuner in a slab-line. The slab-line has an input (test) port (82), a center conductor (81) and grounded side walls (80) and a grounded bottom wall (88). An array of several electronic switches, shown here as PIN diodes (86, 135) are connected (soldered) on the bottom of the center conductor (131 in FIG. 13) and are RF grounded capacitively (85, 136). The reason for capacitive grounding is that the diodes must be capable of being individually DC biased into ON or OFF states. The RF grounded bottom terminal of the diodes (85) is connected to a PCB (printed circuit board) control board (84), which controls the DC bias of each diode separately through a multi-pin connector (194, FIG. 19). The center conductor must be set at a given DC potential through a low pass filter (inductor) or bias tee (87, 901, 118, 157, 1601, 177, 187) in order for control to be able to create a switch-ON or switch-OFF effect. The PCB board (84) is controlled via digital communication (83) by the PC controller.

Figure 7:
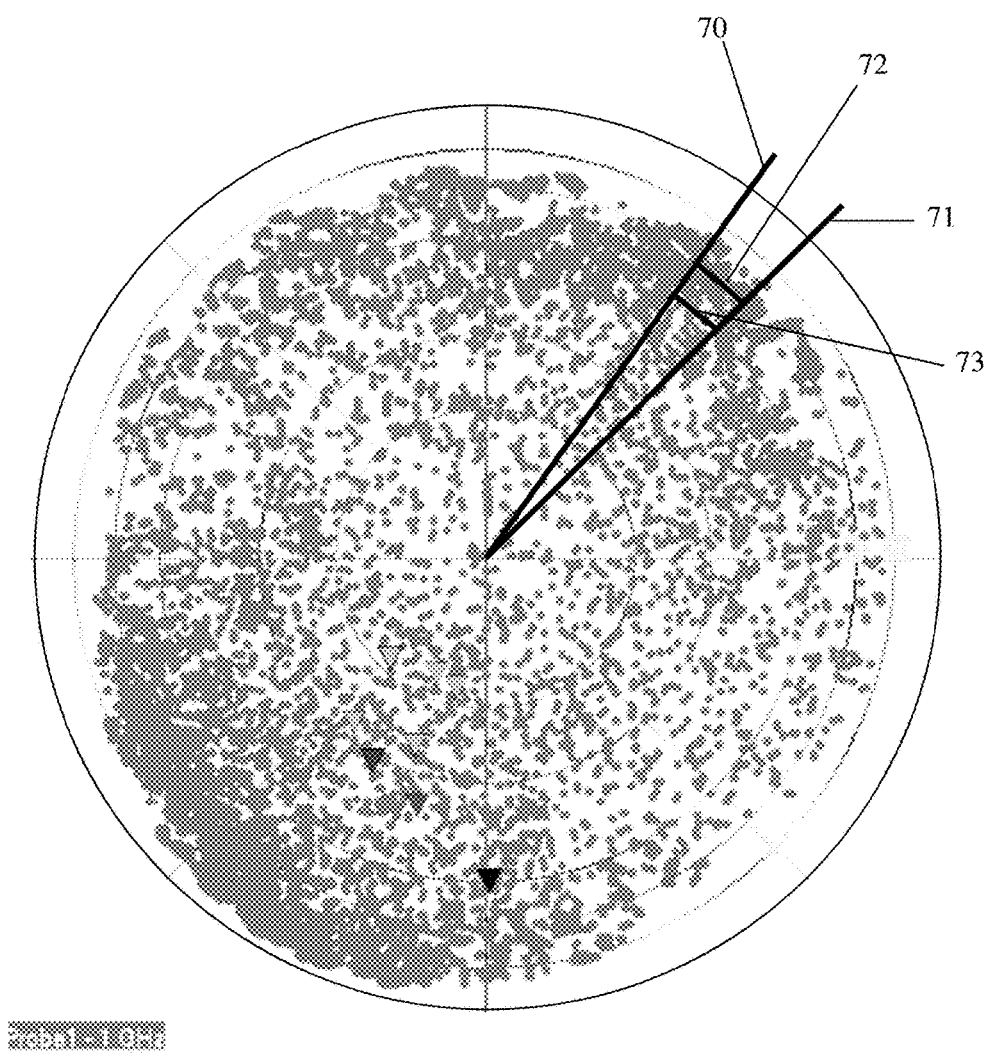
FIG. 7 depicts prior art, calibration points and tuning range of electronic tuner (U.S. Pat. No. 5,034,708).
Figure 9:
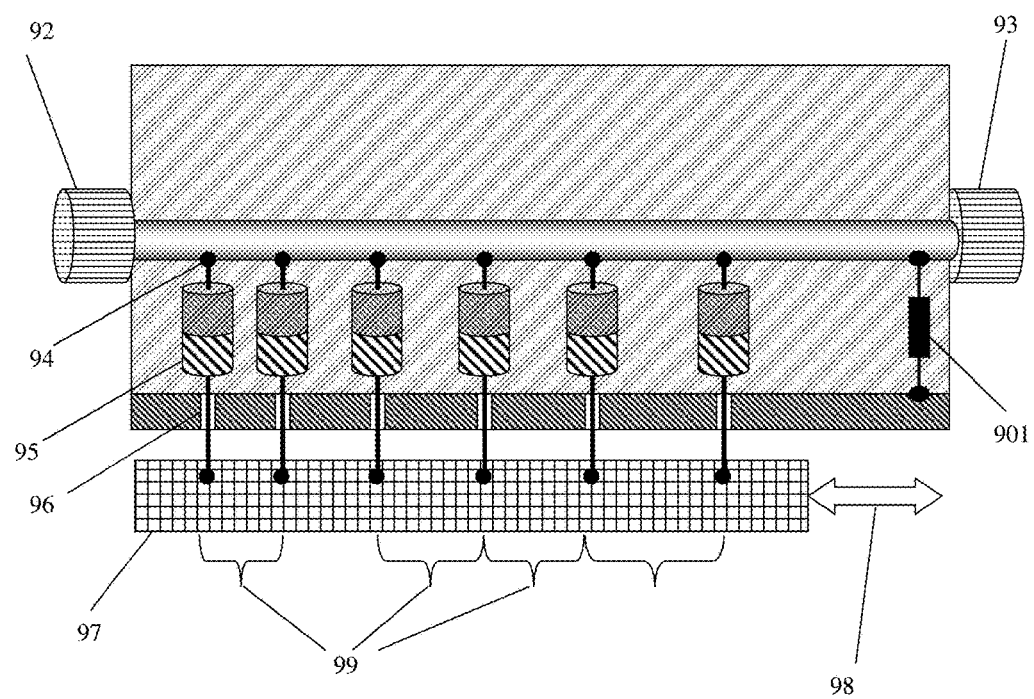
FIG. 9 depicts embodiment of high gamma electronic tuner schematically shown in FIG. 8.

FIG. 9 shows a possible assembly of the PIN diodes inside the slab-line. The distances (99) are calculated using a search algorithm which varies these distances for all permutations of the diodes in ON and OFF states and computes the combined reflection factors over the Smith chart. Varying the distances between diodes arbitrarily in all possible permutations leads to best frequency and Smith chart coverage by properly defining the quantity to optimize. Otherwise calculating the distances manually would only yield the optimum for a narrow frequency band. The quantity to optimize can be a) the sum of all reflection factor vectors, for maximum normalized Gamma, or b) equalizing the number of reflection vectors pointing into each Smith chart segment, delimited (as shown in FIG. 7) by the four traces (70), (71), (72), (73) corresponding to coordinates $(\Gamma_i, \Phi_i)$, $(\Gamma_i, \Phi_{i+1})$, $(\Gamma_{i+1}, \Phi_i)$, $(\Gamma_{i+1}, \Phi_{i+1})$, with $\Gamma$ varying between 0 and 1 in small steps of typically 0.05 and $\Phi$ varying from 0 to 360 degrees in typical steps of 5° or less.

Figure 1:
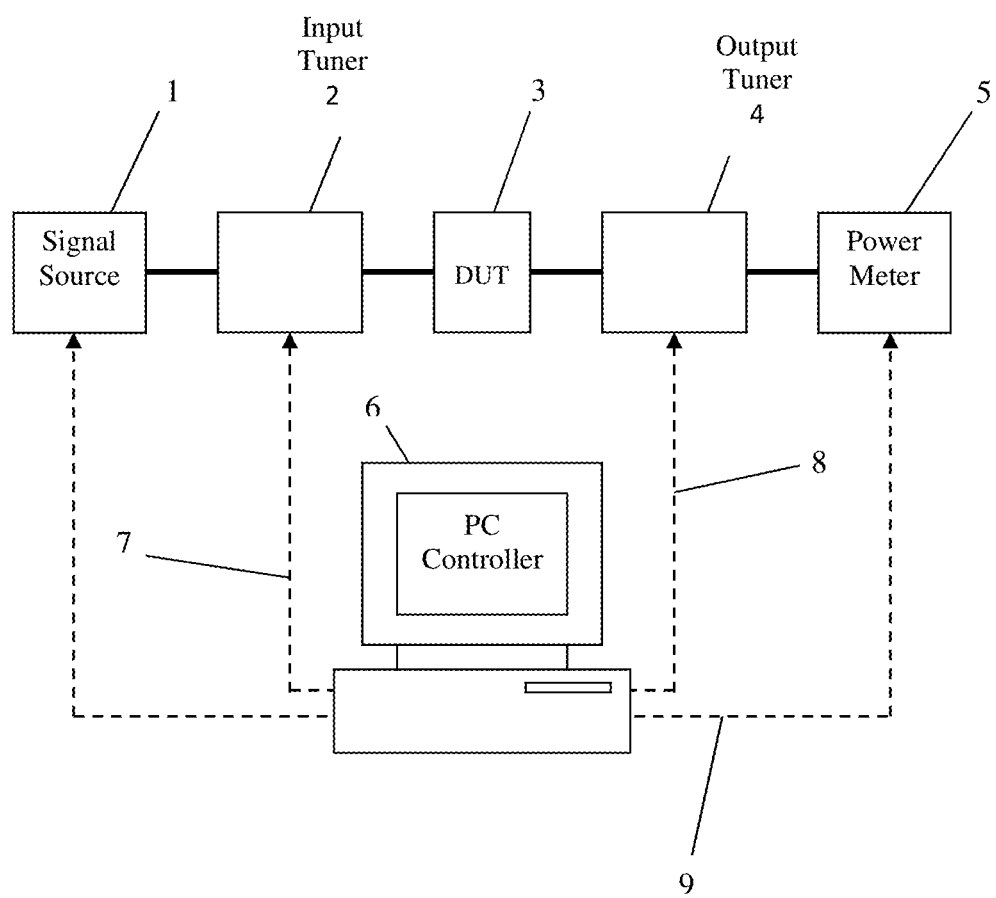
FIG. 1 depicts prior art, typical automated load pull test setup.
Figure 2:
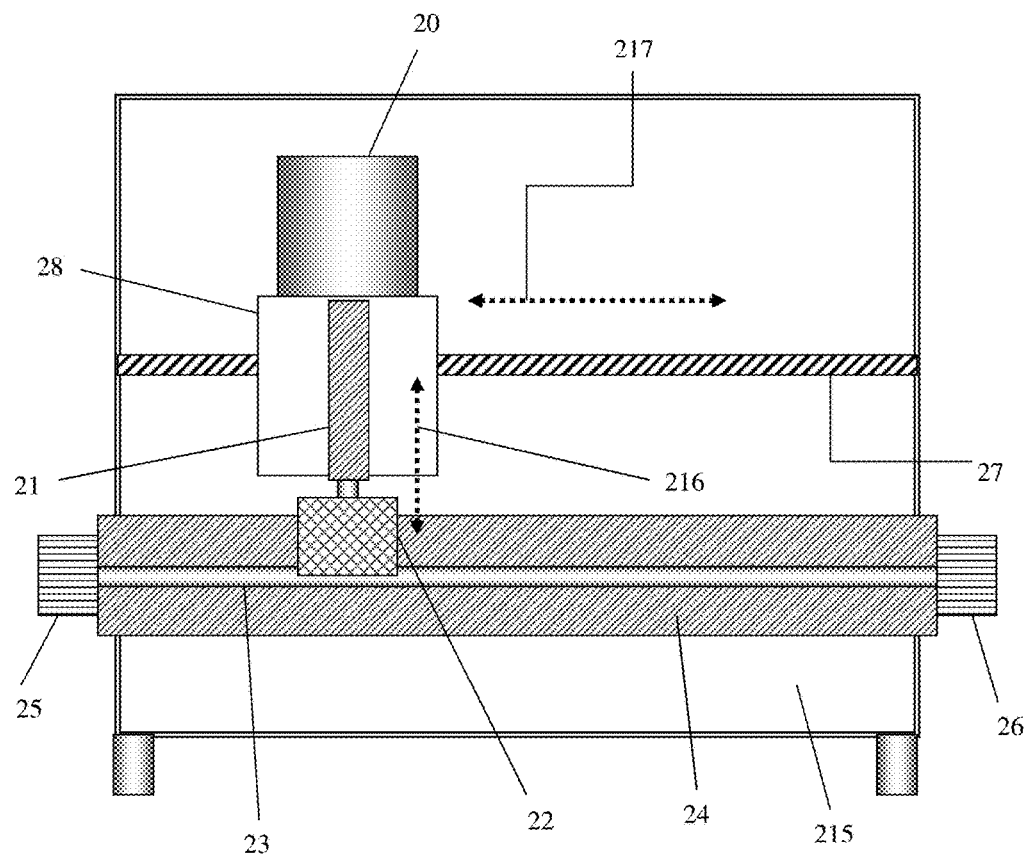
FIG. 2 depicts prior art, front view of slide screw tuner with a single vertical axis and probe.
Figure 3:
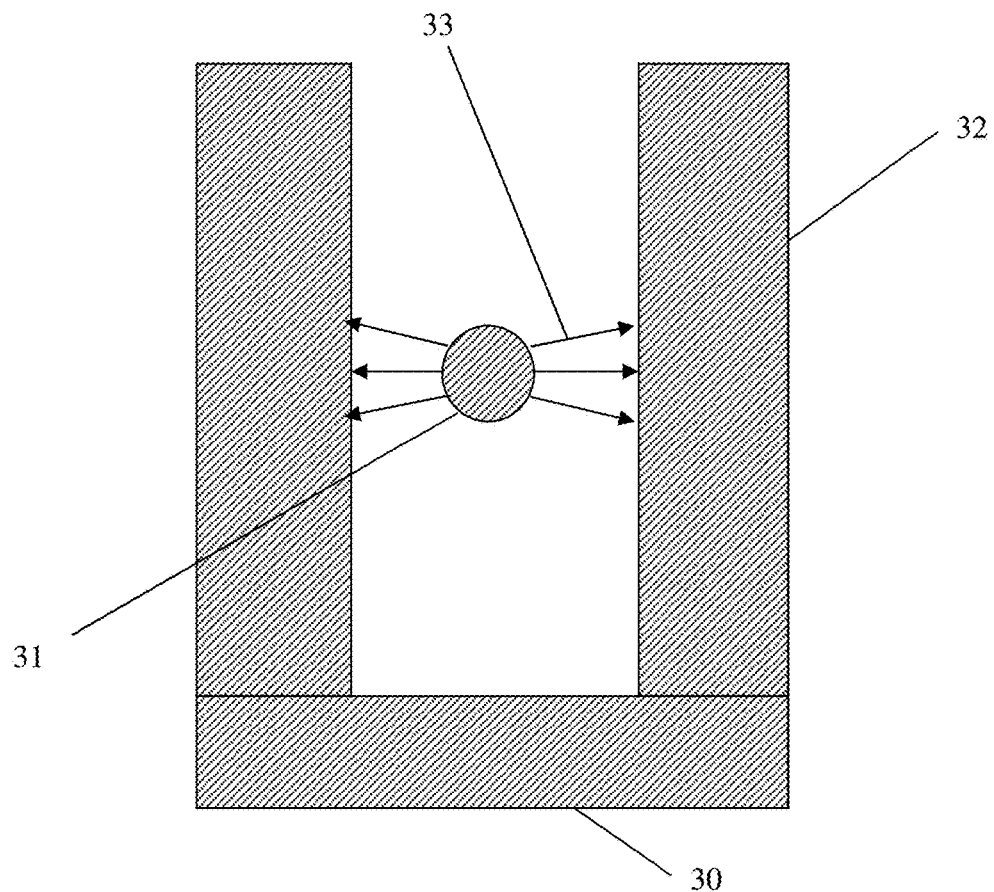
FIG. 3 depicts prior art, distribution of electric field in slab-line (cross section).
Figure 4:
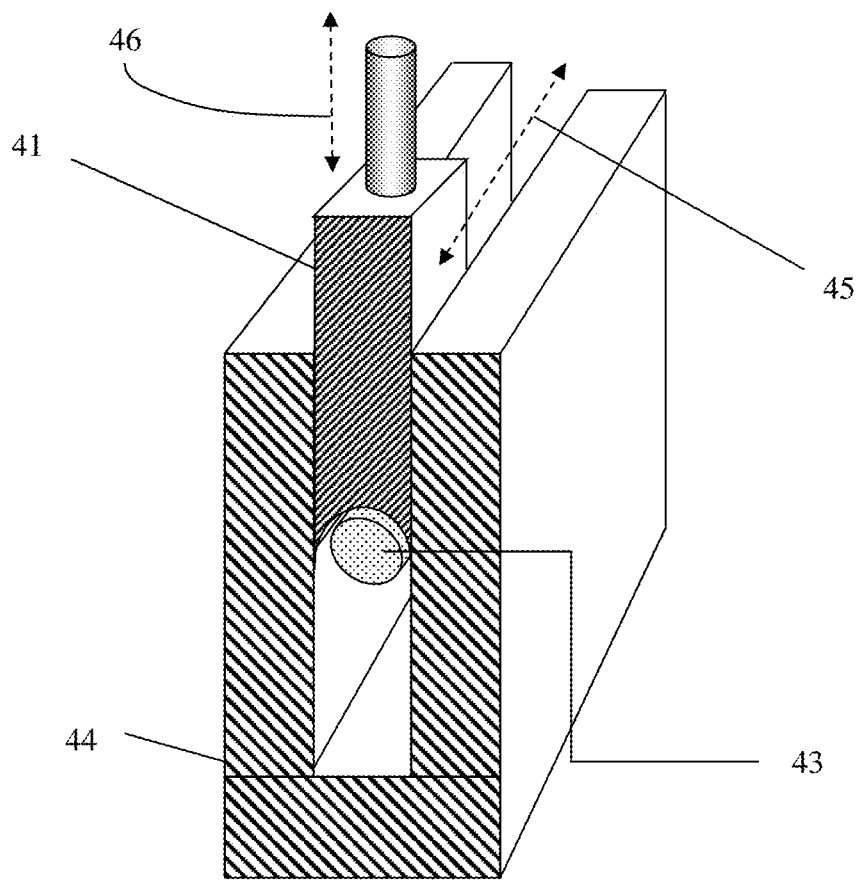
FIG. 4 depicts prior art, perspective view and movement axes of tuning probe in slide screw tuners.
Figure 5:
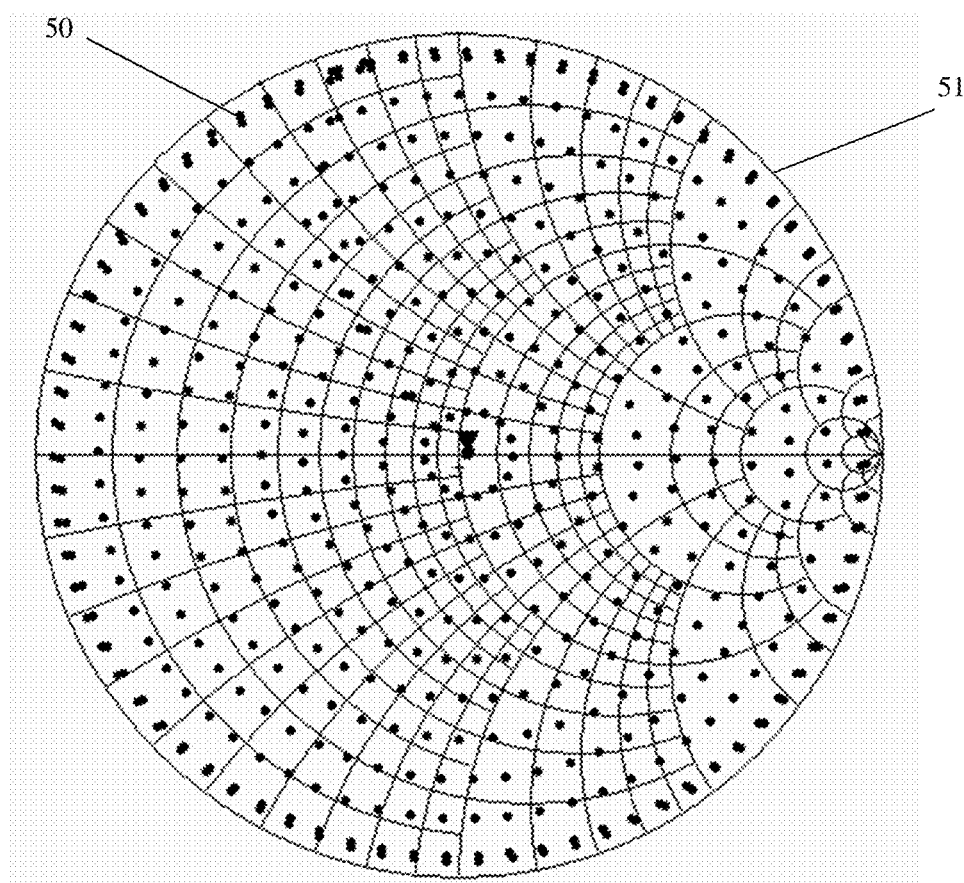
FIG. 5 depicts prior art, distribution of calibration and tuning points in slide screw tuners on the Smith chart.

The difference of distribution of tuning points between mechanical tuners (FIG. 5) and electronic tuners (FIG. 7) is evidence that a different strategy of design and tuning is necessary, because whereas electronic tuners are "digital", mechanical tuners are quasi "analog". Typical automated mechanical tuners, even though in principle also "digital", because of the use of stepper motors, can tune to millions of possible sates, whereas electronic tuners can only tune to $2^N$ states, whereby N is the number of diodes. For N=12 we get 4096 states; for N=16 we get 65,536 states etc. This still does not guarantee even distribution or maximum bandwidth. The distances between diodes must still be optimized.

Figure 6:
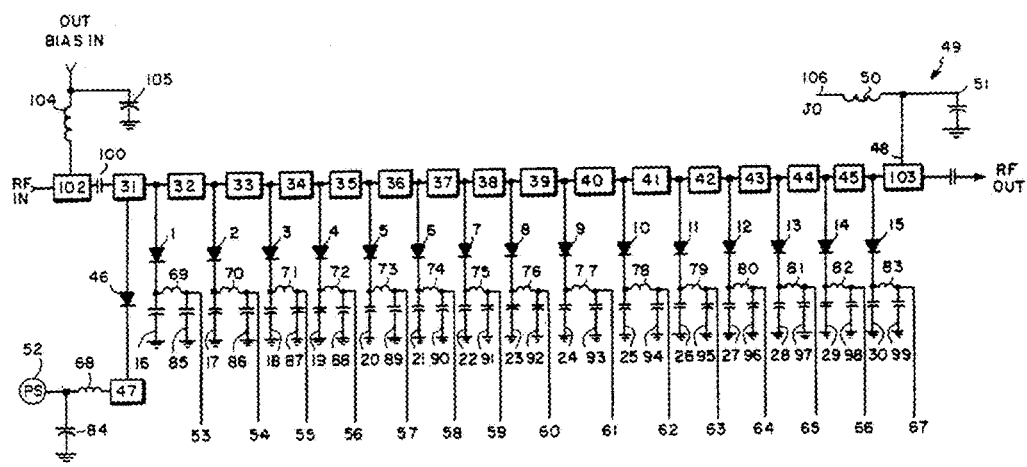
FIG. 6 depicts prior art, electronic tuner using PIN diodes and microstrip lines (U.S. Pat. No. 5,034,708)
Figure 10:
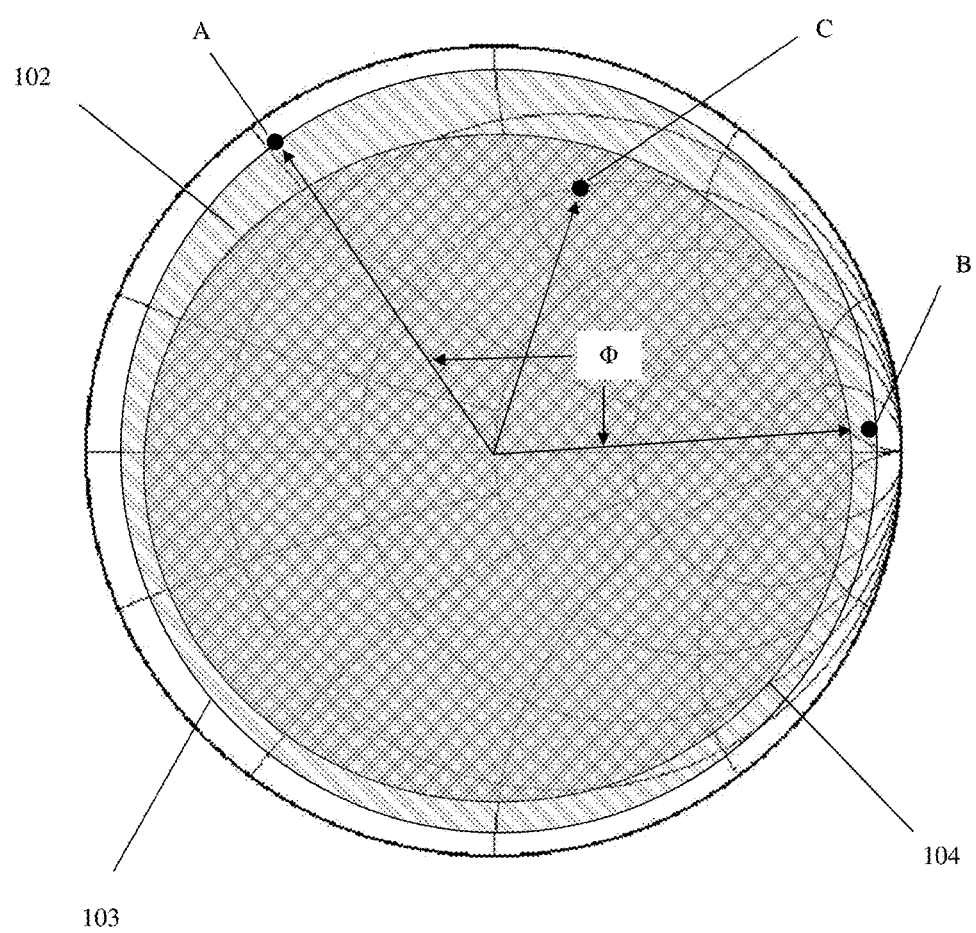
FIG. 10 depicts tuning range of prior art electronic tuner (104) versus high gamma electronic tuner (103) and tuning mechanism.

The main difference between using low loss transmission (such as a slab-line) and medium loss transmission (such as microstrip) appears in the tuning area on the Smith chart: loss reduces the tuning range (FIG. 10). The area inside the border (104) corresponds to the tuning range of prior art electronic tuners (FIGS. 6 and 7) which use microstrip transmission line. Area (102) inside the border (103) corresponds to the tuning range of a high gamma electronic tuner using a low loss airline (slab-line) as a transmission media. Points A, B and C demonstrate how a vector reflection factor C is composed of two reflection factors A and B. By changing either the phase $\Phi$ between the vectors A and B or either vector's amplitude point C can be shifted arbitrarily.

Figure 11:
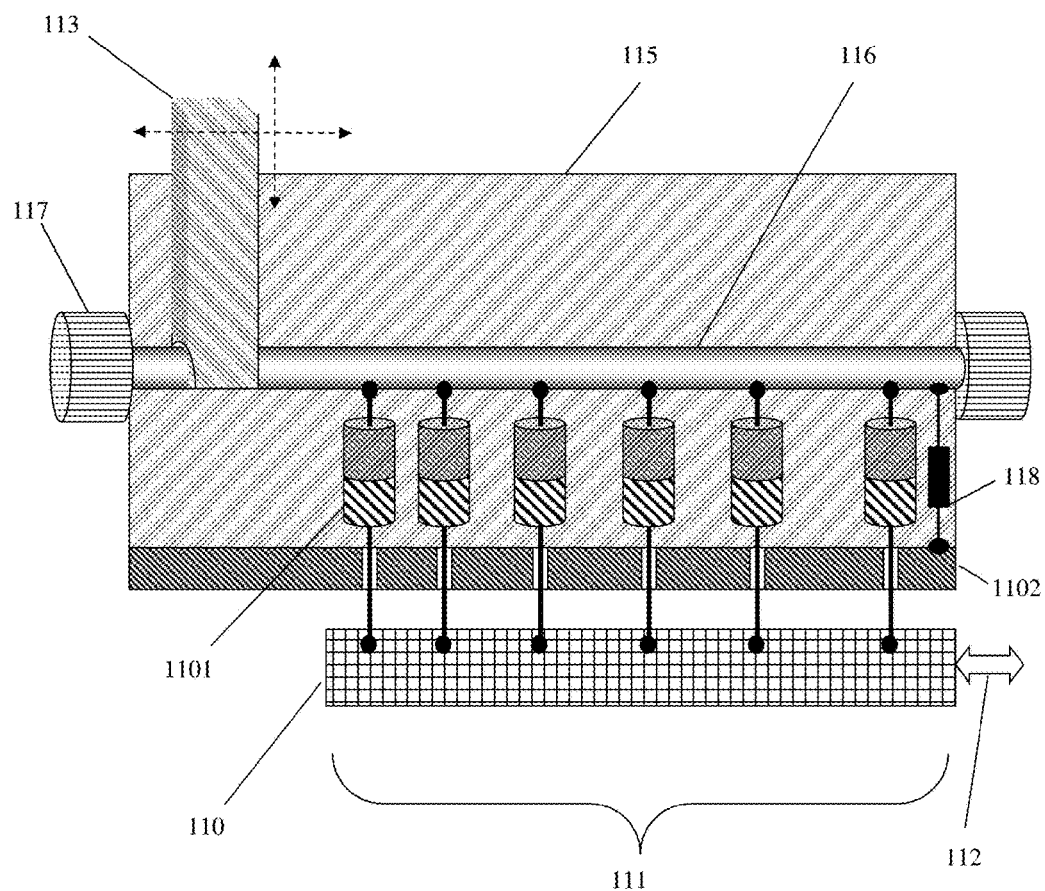
FIG. 11 depicts embodiment of high gamma electronic tuner with pre-matching capacitively coupled metallic tuning probe.
Figure 23:
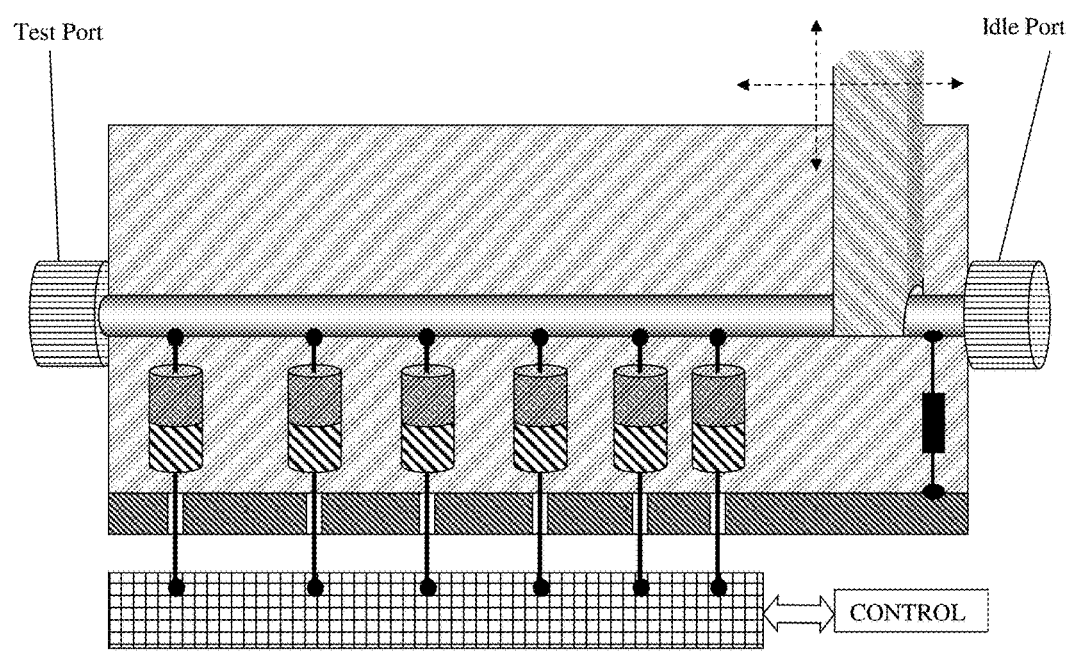
FIG. 23 depicts electronic tuner preceding mechanical tuner used for corrections of residual system return loss, if the mechanical tuning probe is withdrawn in high volume 50Ω production testing.
Figure 24:
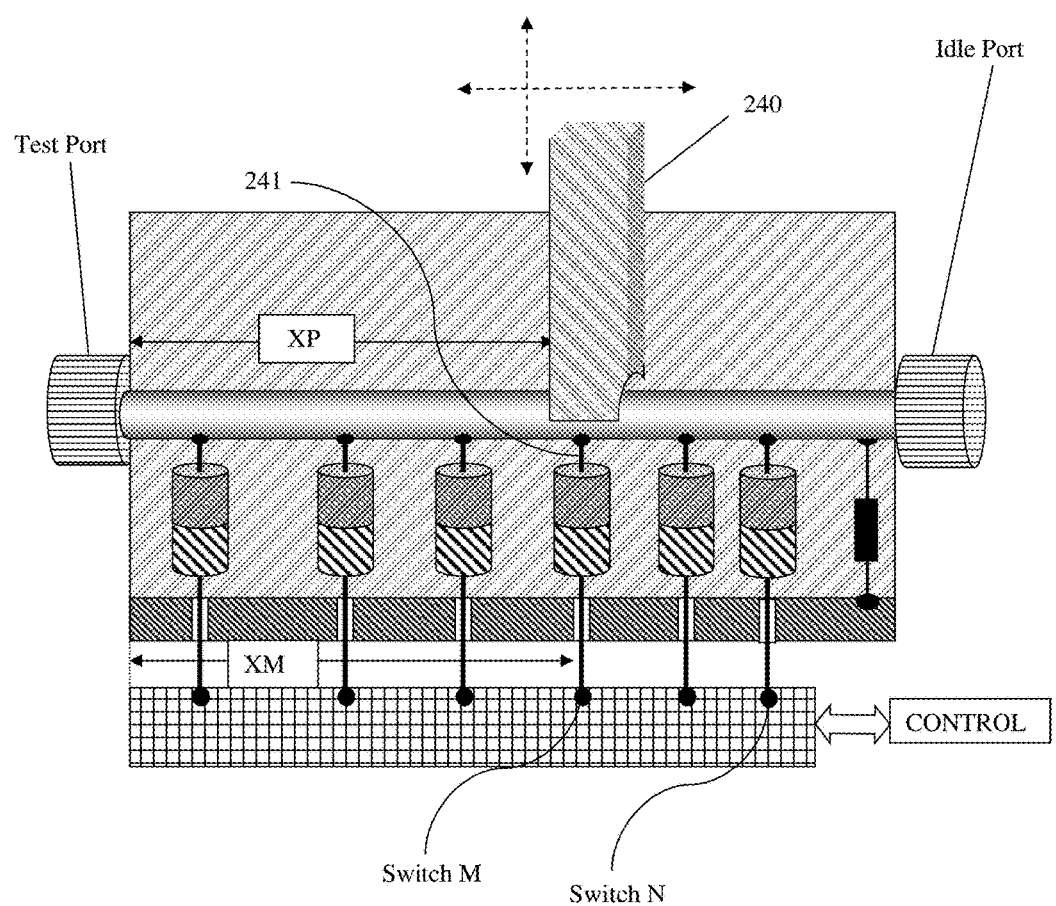
FIG. 24 depicts electronic and mechanical tuner sharing the same section of slab-line.
Figure 25:
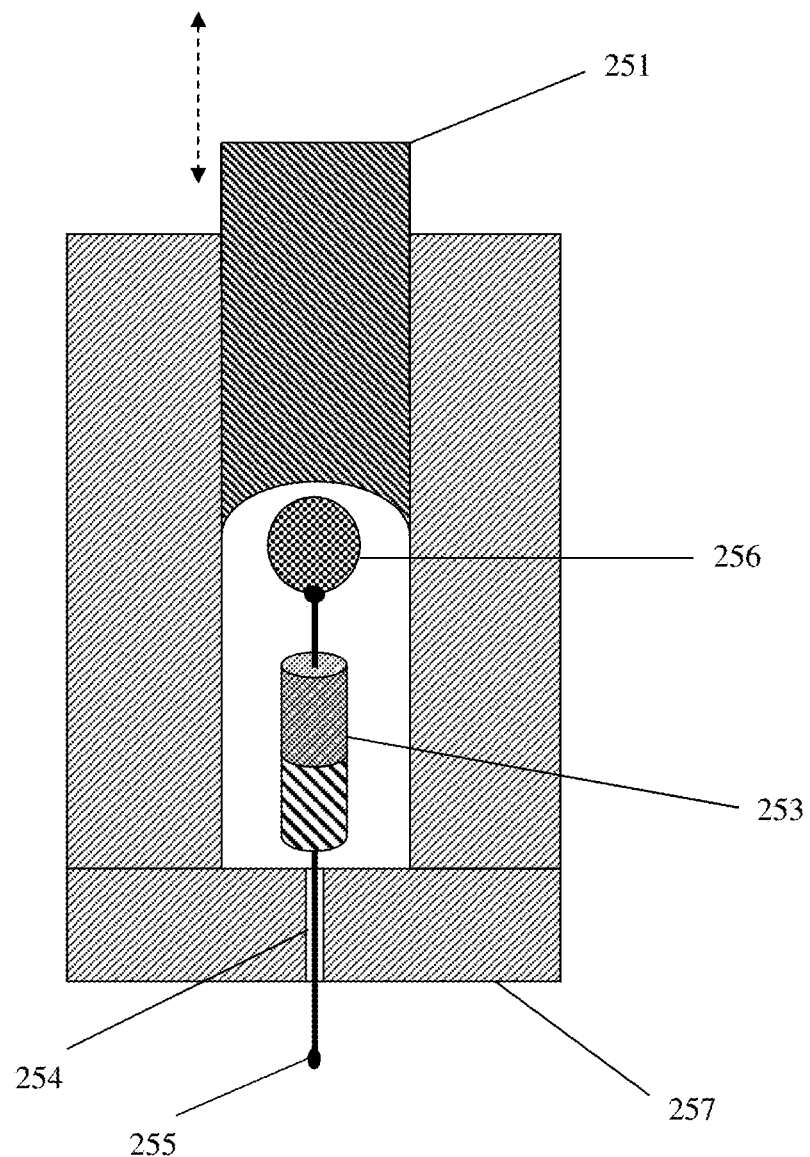
FIG. 25 depicts cross section of metallic tuning probe sliding inside the slab-line sharing the same area with the diodes of the electronic tuner.

The tuning range of the high gamma electronic tuner can be further improved when used in combination with a pre-matching reflective probe (slug). This is only possible as an integrated unit because the electronic tuner itself also uses the slab-line as transmission media. FIGS. 11, 23 and 24 show the various possible operational configurations of the combined electronic-electro-mechanical tuner, whereas FIG. 25 shows why this configuration is possible without mechanical conflict between the mechanically fixed RF switches and the mobile tuning probe. Whereas the tuning probe (251) approaches from the top towards the center conductor (256), the RF switches (253) are connected from the bottom of the center conductor and are RF grounded (254) to the bottom plate (257), while allowing individual DC control through terminal (255). In both cases tuning is possible and efficient and provide the best of both: high resolution mechanical tuning and high speed electronic tuning.

Figure 12:
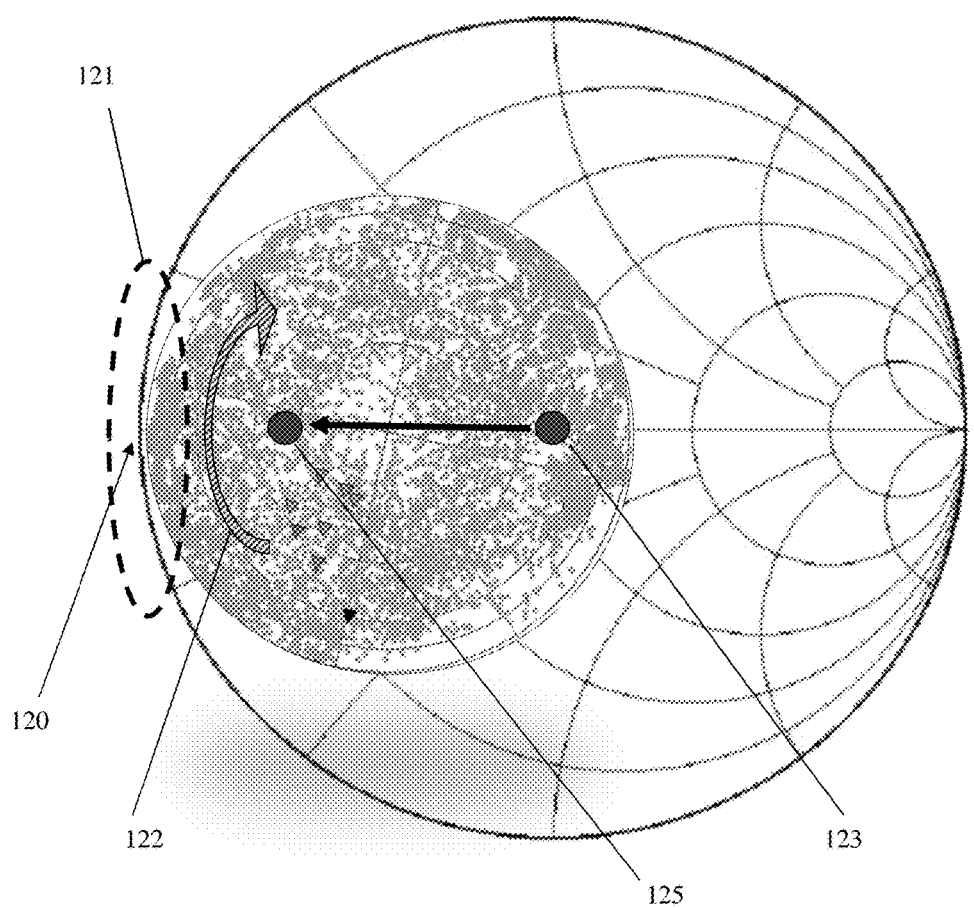
FIG. 12 depicts tuning range of pre-matched high gamma electronic tuner.

The configuration and tuning mechanism of the combined electro-mechanical-electronic tuner is shown in FIGS. 11 and 12. In this case the mechanical tuning probe (113) operates between the test port (117) and the electronic tuner (111). The tuner switches (1101) are controlled by the control board (110) which communicates with the control computer using standard digital communication (112). The DC bias voltage of the center conductor (116) and the common terminals of the RF switches are set to a fixed value, which for convenience may be set to 0 volt, through a grounded (1102) inductor RF choc (coil, 118). One of the slab-line walls is shown here as a background (115).

The effect of mechanical pre-matching is shown in FIG. 12. The cluster of electronically tuned reflection factors of the original (not pre-matched) tuner of FIG. 7, are now shifted by the mechanical pre-matching towards the direction of the pre-matching vector (125), and are not distributed around the characteristic impedance (50 Ohms, point (123)) as before. This allows higher tuning density in the target area (121) and the possibility to reach and power match a very low internal impedance (high power) device (120). The arrow (122) shows the rotation of the whole tuning area by moving the mechanical tuning probe (113) away from the test port (117).

Figure 13:
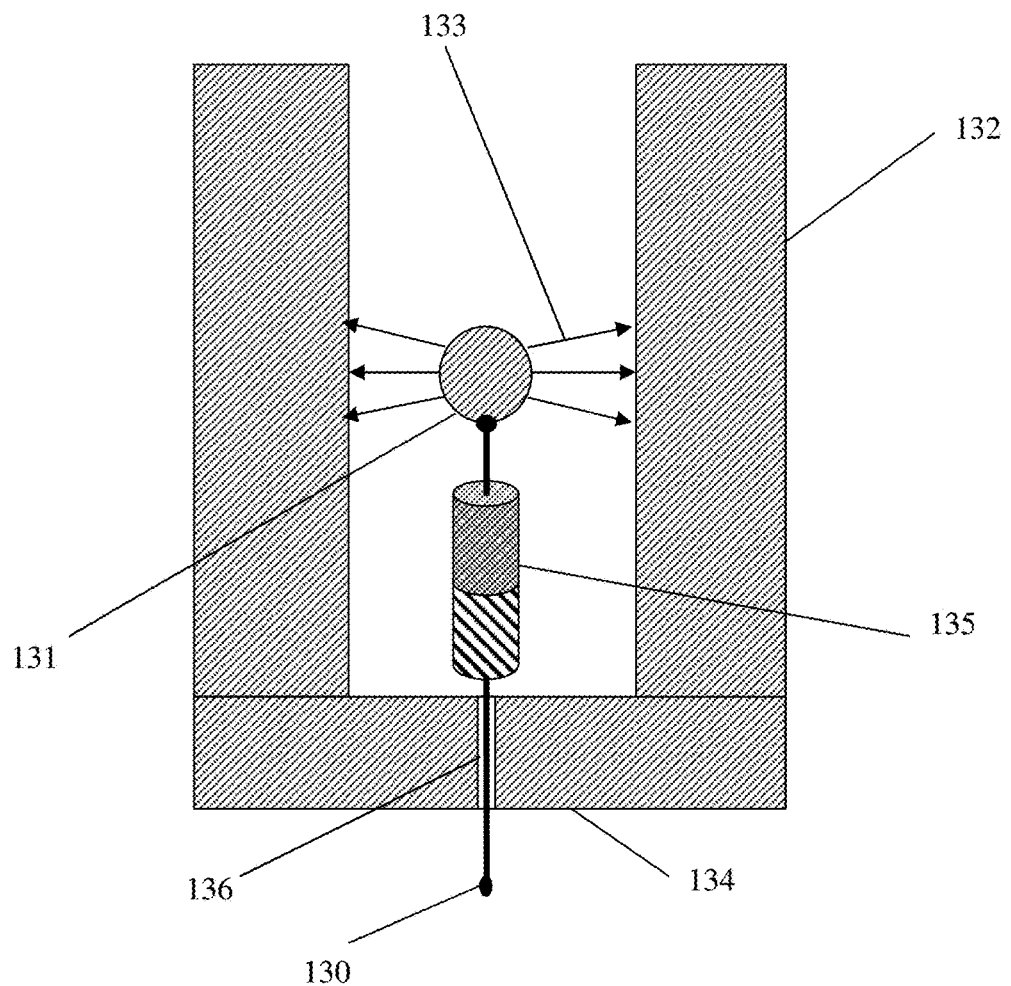
FIG. 13 depicts field distribution in slab-line and mounting of electronic switch (PIN diode or Varactor).

FIG. 13 shows how the mounting of the RF switches does not affect the transmission of the signal through the slab-line, since they are mounted in the low density "dead zone" with respect with the electric field (133). In a slab-line the distribution of the electric field is not the same as in a coaxial line. In a slab-line most field density is concentrated between the grounded walls (132) and the center conductor (131). Disturbances in the area above and below the center conductor are ineffective. This as long as these disturbances are highly resistive; when they become a short circuit, such as is the case when the RF-switches are ON, then we have a reflection factor of 1. When the RF switches are OFF (or OPEN circuit) the effect is very small or negligible. When the diodes are ON (or SHORT circuit) then of course the current flows directly to ground, driven by the small residual electrical field. Since the RF-switch's one terminal (Anode, (135)) is galvanically connected to the center conductor (131) the other terminal (Cathode, (130)) must be DC biased, individually for each switch. This is possible by passing the Cathode lead through a narrow isolated hole (136) in the ground wall (134) and creating RF grounding capacitance. Alternatively, of course, commercially available feedthrough capacitors can be used.

Figure 16A:
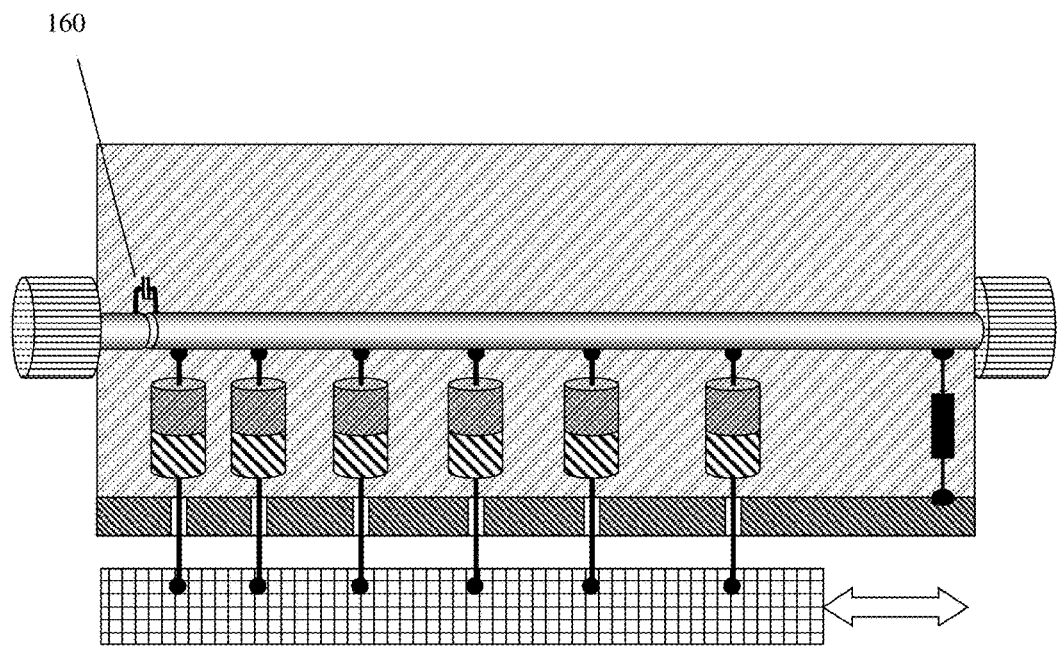
FIG. 16A depicts high gamma electronic tuner.
Figure 16B:
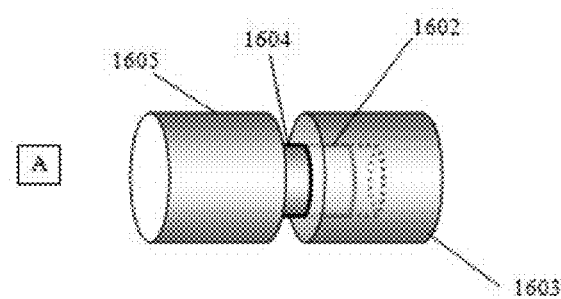
FIG. 16B depicts detail (A) of built-in DC decoupling.

If the components to be connected to the tuner test port carry DC voltage (are not grounded), then the test port must be DC isolated. This is done typically using a DC block (158) (FIG. 15) or (160) (FIG. 16). A chip capacitor can be soldered between two pieces of center conductor (158), however this solution is mechanically critical for hindering the positioning and holding the center conductor properly. A better solution is shown in FIG. 16B, detail "A". The solution consists in shaping an insertion pin (1604) and associated hole in two adjacent pieces of the center conductor of which the shorter (male) one (1605) shall be made of aluminum; then anodizing the male part (1605) before inserting into the female part (1602). Anodization is a chemical process which creates a thin insulating layer on the surface of the aluminum, thus ensuring DC isolation. The dielectric constant and thickness of the anodization layer on the pin (1604) will create a series capacitance enabling efficient RF transmission along the center conductor (1603). This way the center conductor can be handled quasi as a single piece. The remaining components of the tuner in FIG. 16A are the same as in FIG. 15.

Figure 17A:
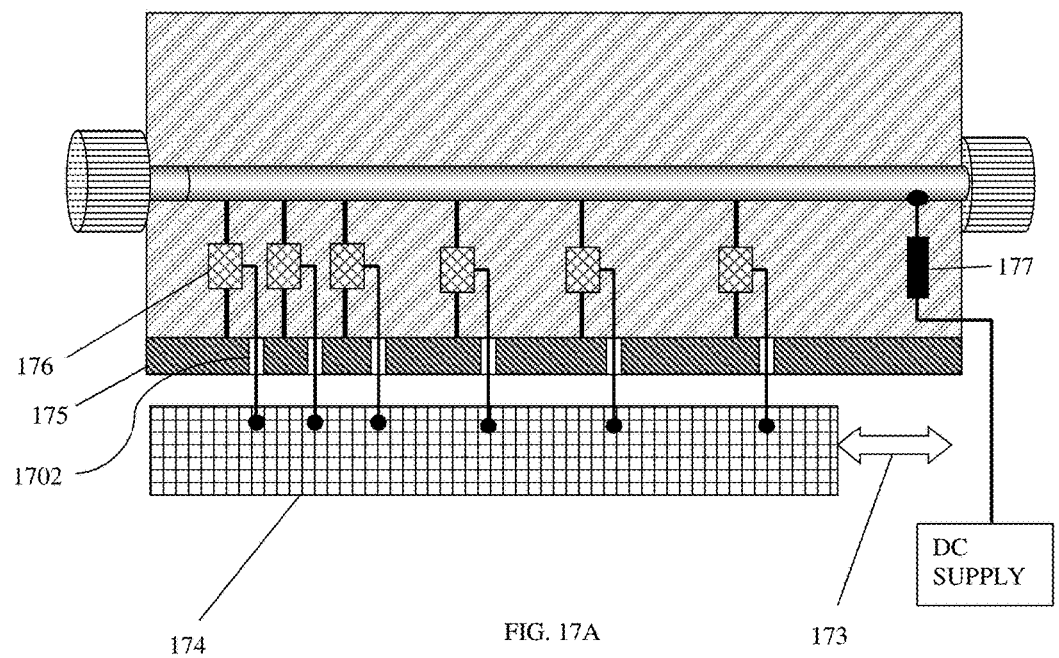
FIG. 17A depicts electronic tuner with MOSFET switches.
Figure 17B:
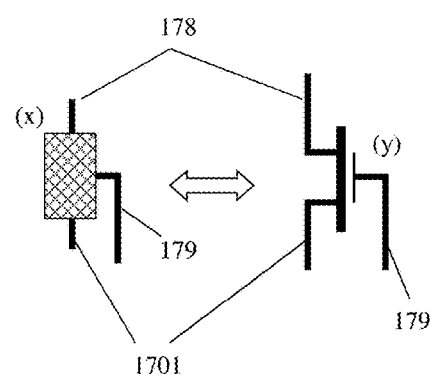
FIG. 17B depicts electric symbolic diagram of MOSFET (used here as switches).

Alternatively to PIN diodes field effect transistors (MOSFETs, FIG. 17) or voltage controlled capacitors (Varactors) can be used. MOSFETs (176) have the advantage of being driven through their Gate control terminal (179), which requires much less control power. In fact MOSFET's do not require any control current, only a control voltage. When MOSFETs are ON their drain (178) to source (1701) resistance is very small, less than 2-3 Ohms, when they are OFF it switches to the range of a few kilo Ohms. So the OFF/ON resistance ratio is close to 1000, which is even higher than with PIN diodes. FIG. 17A shows the assembly of the MOSFET's. In one embodiment the center conductor, connected to the MOSFET drain (178) is biased to a positive DC drain voltage, such as 10 or 20V and the source (1701) to ground (175). The gate terminal is fed through feedthrough capacitors (1702, 254) to the control board (174), which then communicates with the controller (173). The inductor (177) allows the center conductor and MOSFET drain to be DC biased by connecting to a 10 or 20V DC Supply.

Figure 18:
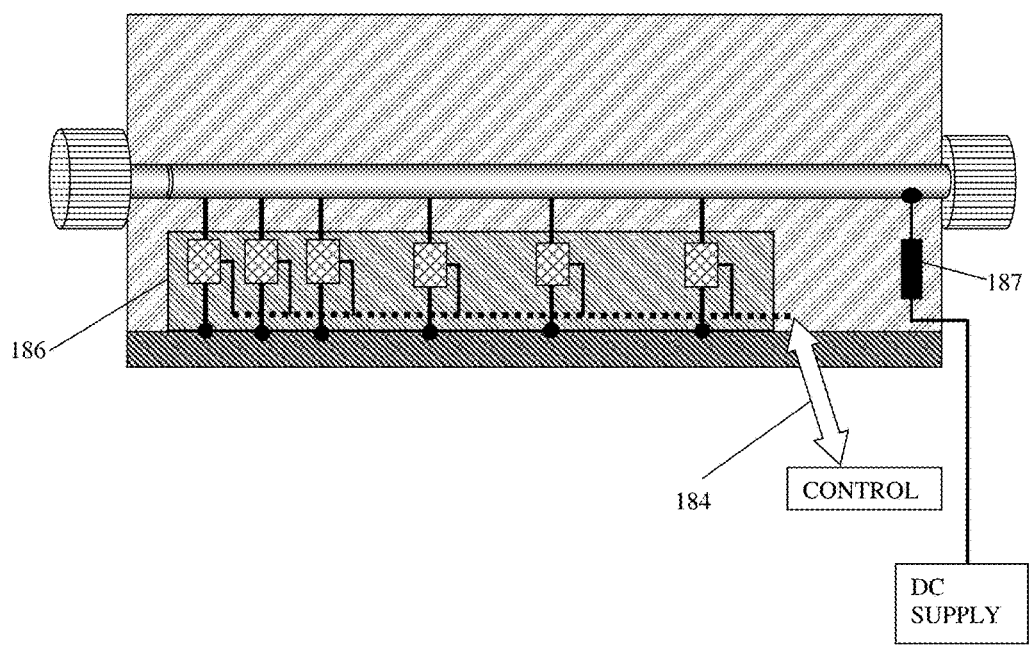
FIG. 18 depicts high gamma electronic tuner with MOSFET switches (detail see FIG. 22).
Figure 19:
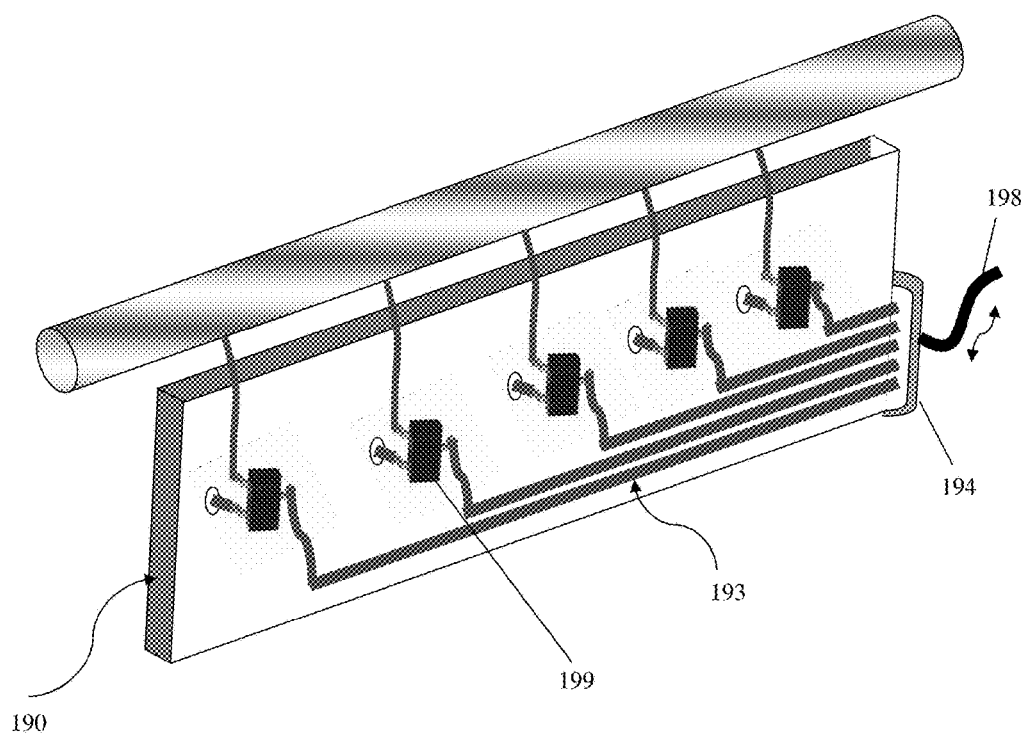
FIG. 19 depicts perspective view of switchable MOSFET array on a PC board insertable in slab-line for electronic tuner.
Figure 22:
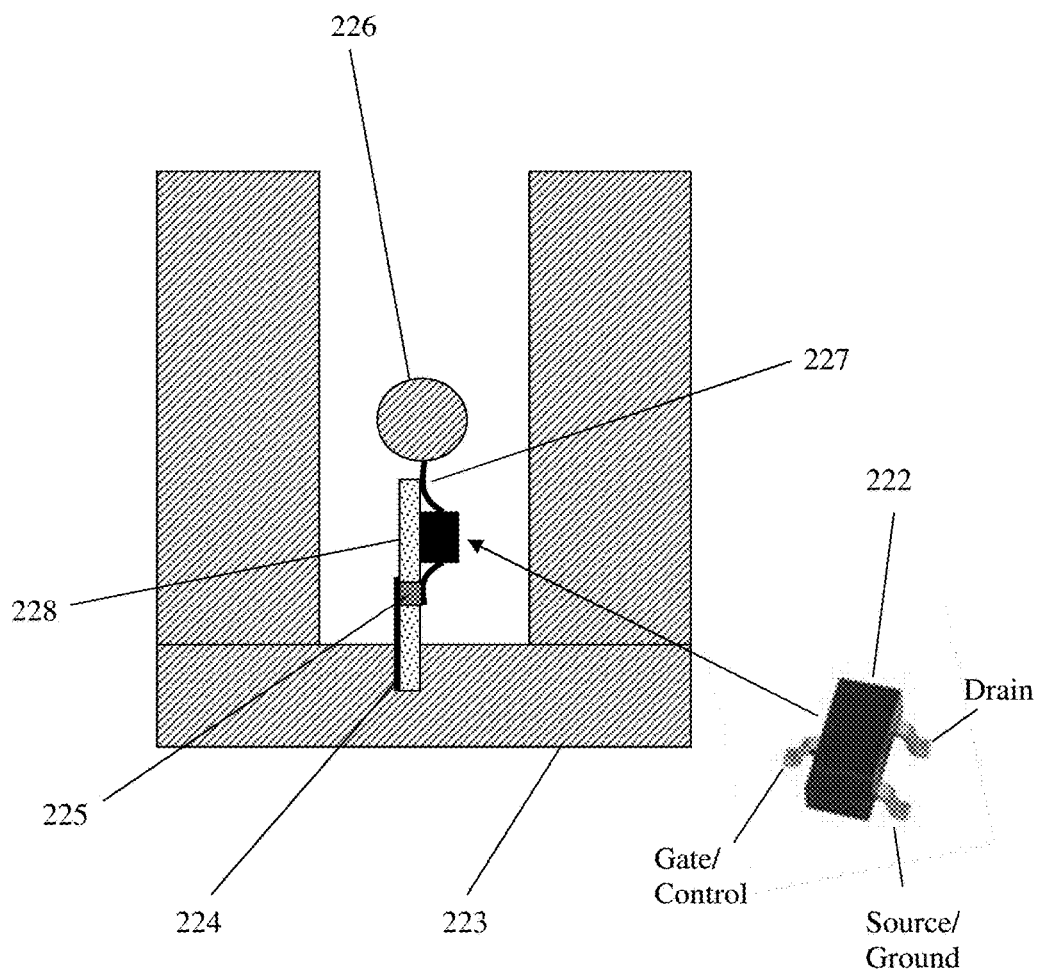
FIG. 22 depicts detail (cross section) of PC board assembly using MOSFETS mounted between center conductor and ground plane in slab-line.

FIGS. 18 and 19 show embodiment of an array of MOSFET switches mounted as a complete set on a printed circuit board (PCB, 186, 190) at the predefined distances to each-other for optimum Smith chart and frequency coverage. The gate control is standard procedure on PCB ((184, 193) and the control lines (193) of the whole array (184) are connected digitally (198) with the controller using appropriate multi-pin adapters (194). FIG. 22 shows the PCB (228) carrying the switches (222), which can be either the MOSFETs (FIG. 19) or the PIN diodes (FIG. 16) mounted vertically in the slab-line below the center conductor (226). The drain terminals (227), or the anodes of the PIN diodes, protrude from the PCB (228) and are connected to the underside of the center conductor (226) and the PCB has a metallized via hole (225) to connect the source terminal of the MOSFET (or cathode of the diodes) to the grounded layer of the PCB (224), which is then grounded by inserting into a slot, machined in the bottom plate of the slab-line (223).

Spacing the electronic switches along the slabline (99) is optimized using a network model. The reflection factor at the test port (92) is calculated for all permutations of the switches (95) between ON and OFF states and the distance (99) between switches along the center conductor is randomly changed within the boundaries (length) of the slabline between test (92) and idle (93) ports. An optimization routine maximizes the sum of all generated reflection factor vectors over a frequency range as a function of the selected distances. Graphically this corresponds to a cloud as shown in FIG. 7. The average radius of the cloud is calculated for a frequency band and the distances are further optimized.

There are analytical methods of doing this distance optimization (see ref. 3), but with today's computing power and easiness the random search optimization is far more efficient. Further optimization targets can be defined and used in order to concentrate reflection factors in a specific area of the Smith chart, or maximize tuning range at a certain frequency. In those cases, though the spacing of the switches would be permanent. Using an overlapping mechanical tuning probe solves this problem of targeting a specific area dynamically (see FIG. 12, item 121).

In further embodiments the electronic tuner is combined with mechanical tuner. The various configurations are shown in FIGS. 11, 21, 23 and 24. Because the electronic tuner components (PIN diodes (253) or MOSFETs, individually, or as a group mounted on a PCB (228)) are all inserted below the center conductor (226), (256), (FIGS. 22 and 25) there is no mechanical conflict with the tuning probe (251) which approaches from the top. Therefore either of the configurations in FIGS. 11, 23 and 24 is operational mechanically conflict-free. The tuner behavior is different though in each configuration, as the s-parameter matrices of each tuning group combine differently, depending if the mechanical tuning is closer to the test port (FIG. 11) than the electronic tuning, or closer to the idle port (FIG. 23) or if the two tuning sections are overlapping (FIG. 24).

Figure 14:
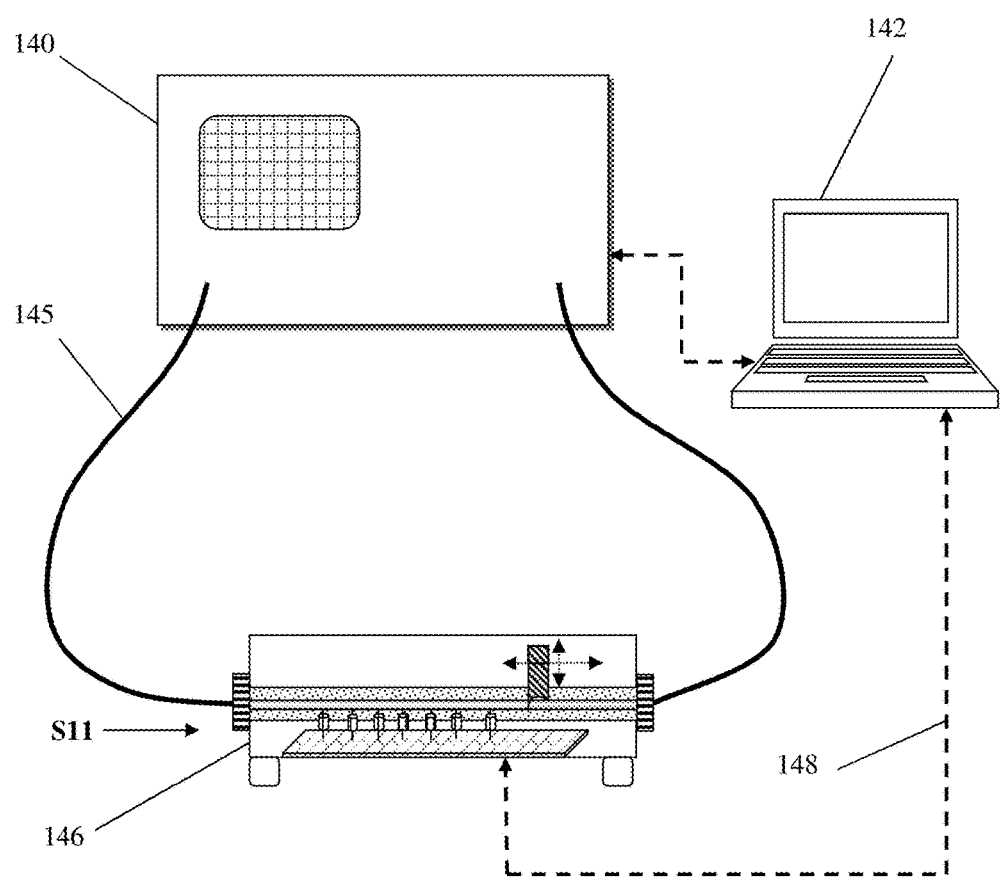
FIG. 14 depicts calibration setup for high gamma electronic tuner.
Figure 15:
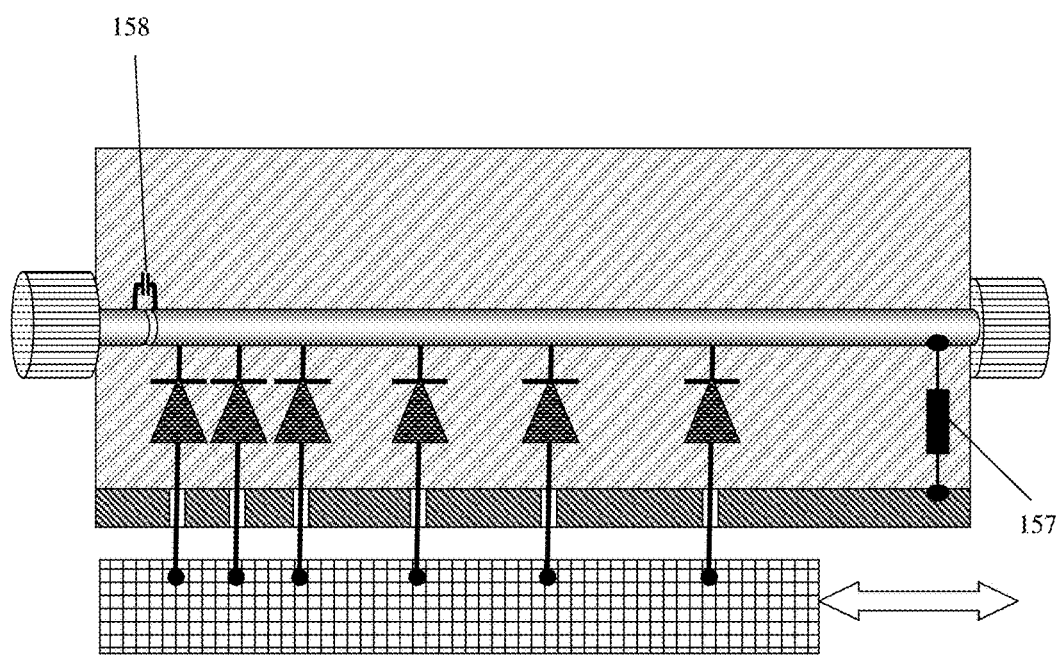
FIG. 15 depicts high gamma electronic tuner with DC decoupling.

The tuner must be calibrated before it can be used to synthesize user defined impedances (tuning). Calibration of the tuner is the same, though, in all configurations, whether using PIN diodes, Varactors or MOSFET switches. The tuner is connected to a pre-calibrated network analyzer (VNA), FIG. 14; the electronic switches are set to all permutations of states and scattering parameters (s-parameters), see ref. 4, are measured and saved in a calibration file for each test frequency. The calibration file includes up to $2^N$ sets of s-parameters, each set comprising 4 complex (8 real) numbers, per frequency. This can be done frequency by frequency with stepping through the tuner states, or state by state and stepping through the frequency. In either case for synthesizing concrete impedance the right data points must be retrieved from the calibration file and loaded into active computer memory and scanned through to identify the right setting of electronic switches, for which the reflection factor at the test port (S11) is closest to the requested target (S11.target).

If one or more mechanical tuning probes are included in the overall tuner and ride over the same center conductor on the bottom of which the electronic tuners are attached, the situation is different. In this case, because of the high resolution of the probe control motors and gear, the possible combined permutations of tuner states are in the millions and cannot be all measured. Typical maximum numbers of mechanical probe positions are 2000 vertical and 2000 to 10,000 horizontal resulting in 4 million to 20 million states (see ref. 2). Therefore only a selected, representative, set of states is measured, typically 400 to 1000. However, since the mechanical tuner and the electronic tuner are mounted in the same housing the corresponding s-parameters cannot be separated: each time an electronic tuner setting is measured, with the mechanical tuner initialized (probe withdrawn), the s-parameters of the of both the electronic tuner and the (initialized) mechanical tuner are included; we end up doubling the effect of the tuner housing. In this case the procedure includes a de-embedding step, in which the s-parameters of the "initialized" tuner, i.e. the tuner state at which the mechanical probe(s) are withdrawn from the slab-line and all electronic switches are OFF (open circuit), are measured and saved in a INIT-MATRIX [S0] s-parameter set. Then each mechanical tuner probe is positioned at various horizontal and vertical positions, selected in order to cover the whole Smith chart at the test frequency, within the probe's vertical mechanical limits and moving at least one half of a wavelength along the slab-line, and are temporarily saved. S-parameters of the switching permutations of the electronic tuner, with the mechanical tuner initialized, are also measured as described in the previous paragraph. Then the s-parameters of the tuner section closest to the idle port are de-embedded by the [S0] matrix (cascaded with the inverse of [S0], see ref. 4) and then all s-parameter permutations of mechanical and electronic states are cascaded in certain order in computer memory and saved. This procedure covers situations as shown in FIGS. 11 and 23, whereby the mechanical probe(s) are not overlapping with the electronic tuning area; in the case of FIG. 11 the electronic tuner follows, in the case of FIG. 23 the mechanical tuner follows.

The mechanical tuner probe has a certain length, in direction of the axis of the slab-line. Therefore in a number of cases in the configuration of FIG. 24, the probe (240) will be over the contact point (241) of an electronic switch (PIN diode, Varactor, MOSFET). In this case it shall be decided which part of the tuner is to be de-embedded with the [S0] matrix and which not. Since the reflection at the probe is created at its point closest to the test port, it is considered to be the starting reference plane of the mechanical tuner.

In this case we have in fact three tuners cascaded: one electronic section between test port and mechanical probe, the mechanical tuning probe itself and another electronic tuner section between the tuning probe and the idle port. In cascading the s-parameters of those three tuners care must be taken to conserve in the original form, as directly measured, only the tuning section closest to the test port and de-embed the other two. Tuning section is considered an area where the tuning switch or probe "can" be activated (in the case of the electronic tuner the switch "can be switched ON", and in the case of the mechanical tuner, "the probe can be inserted"). For instance, if the horizontal position (Xp) of the mechanical probe is between the $4^{th}$ (Xp=X4) and $5^{th}$ (Xp=X5) switch, i.e. (X4<Xp<X5), the electronic tuner s-parameter matrix comprising switches 1 to 4 ($2^4$ permutations) will be cascaded with the mechanical tuner parameters for X4<Xp<X5 and then with the electronic tuner parameters for switches M=5 to N. As the mechanical probe moves horizontally, the number of switches M to be included in the first part must be recalculated every time. So in general terms, the first part including $2^M$ sets of s-parameters is cascaded with the mechanical probe P parameter sets for $X_M$<Xp<$X_{M+1}$ and then to the second section of electronic tuner $2^{N-M}$ sets.

In short, calibration occurs in 4 steps: A) all switches and probe(s) are initialized and the s-parameter INIT matrix [S0] is measured and saved for all test frequencies; B) with the mechanical probe initialized (withdrawn) the s-parameters of all permutations of switches are measured and saved in a matrix comprising $2^N$ sets of s-parameters: C) all switches are turned OFF (open circuit) and the mechanical probe is moved to a multitude K of horizontal (X) and Z vertical (Y) positions covering the whole Smith chart at the specific frequency, between the test port reference position (zero) and Xmax and between Y=Ymax (closest to center conductor without shorting) and Y=0 (withdrawn); Typical values of K vary between 50 to 100 and Z between 10 and 20, resulting in 500 to 2000 calibration states, and s-parameters are measured and saved in a matrix [S(X,Y)]; D) the total tuner calibration matrix is created in computer memory by cascading matrices as follows: All mechanical tuner s-parameters remain original; all electronic tuner parameters, generated by switch permutations, are de-embedded. Mechanical tuner s-parameters are cascaded with electronic tuner s-parameters, following the rule outlined above, creating a total calibration matrix of $2^N*K*Z$ elements from a minimum of 512,000 (10 switches, 50 horizontal and 10 vertical steps) to a maximum of 32,758,000 (14 switches, 100 horizontal and 20 vertical steps). Whereas measuring time of all those permutations would be unrealistically long (142 hours for 512,000 permutations and 379 days for 32,758,000 permutations), the de-embedding technique permits reducing calibration time to a total between 25 minutes minimum (for 512,000 settings) and 5.1 hours (for 32.7 million settings) at a maximum, allowing for 1 second per setting and VNA s-parameter measurement time.

Figure 20:
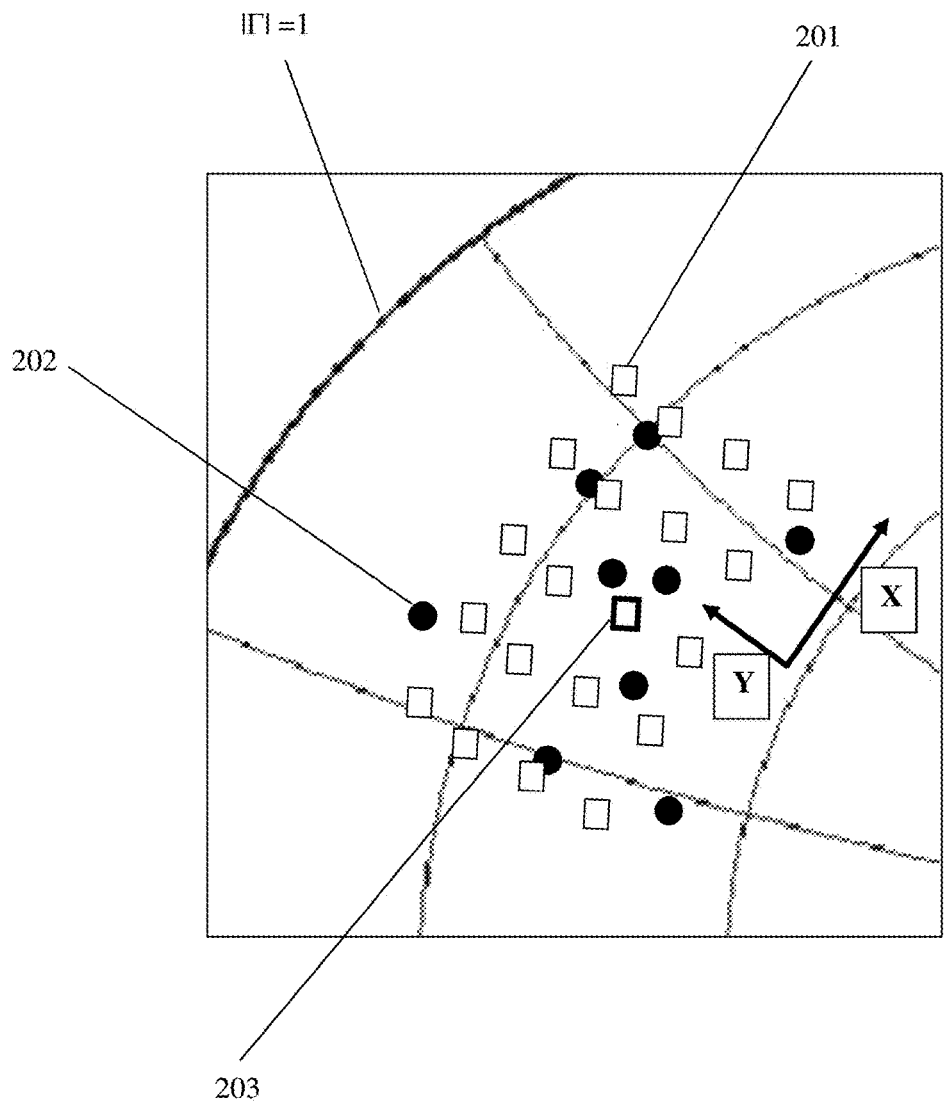
FIG. 20 depicts segment of Smith chart showing electronic (●) and mechanical (□) tuning states; □ is the target vector Gamma-target; X, Y are horizontal and vertical coordinates of prematching tuning probe (113 in FIG. 11).
Figure 21A:
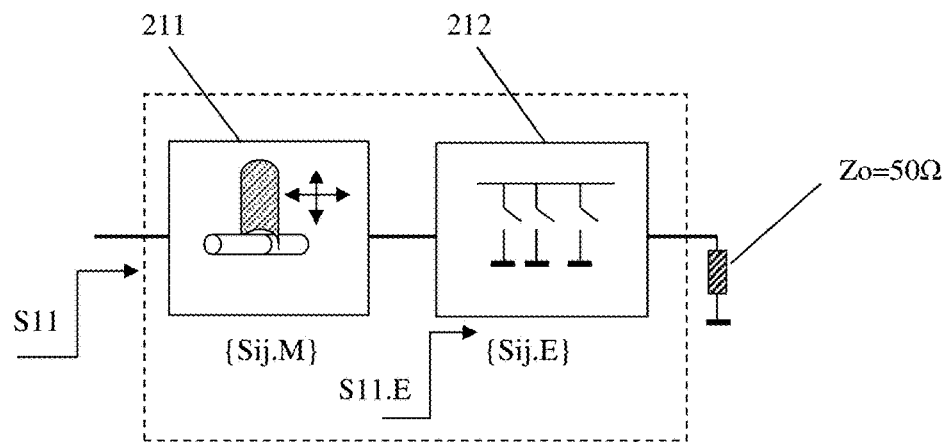
FIG. 21A depicts operation of metallic tuning probe preceding the electronic tuner segment.
Figure 21B:
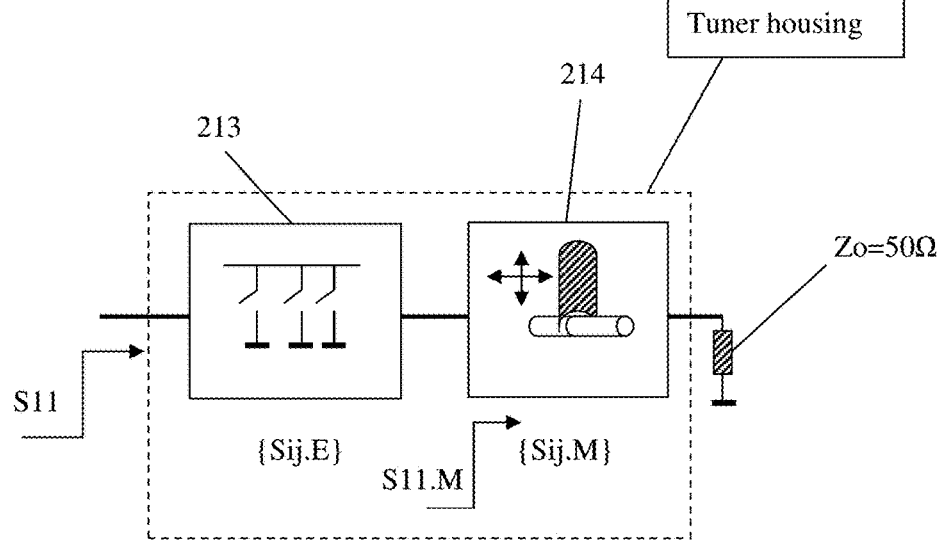
FIG. 21B depicts the electronic tuner preceding the metallic tuning probe; both units are operable without conflict in the same tuner housing.

In a simple mechanical tuner, the extremely high tuning resolution allows synthesizing impedances (202) between calibrated points (201), FIG. 20. In the case of electronic tuner, even though in some areas the tuning density is high (first and third quadrant close to the edge of the Smith chart in FIG. 7), this is not possible, and the tuning resolution is limited. Therefore in combined mechanical-electronic tuning the mechanical part must be superimposed to the electronic part and fine-tuned. The electronic part can only be used at the discrete states, at which it has been calibrated, interpolation between calibrated states is impossible in electronic tuners.

The invention has been described in a preferred number of embodiments. No obvious alternative shall impede on its originality and validity.

I claim:

1. An electro-mechanical and electronic combo impedance tuner including
   an electromechanical tuner, comprising
      a slotted low loss airline (slabline) having a test port, an idle port, a center conductor linking the ports and a tuning probe, horizontally (X) movable along the axis of the slabline, insertable into the slot of the slabline and capacitively coupled from the top with the center conductor;
   and
   an electronic tuner, comprising
      a multitude N (N>1) of independently controlled RF switches, mounted at selected fixed positions along the center conductor between the bottom of the center conductor of the slabline and RF ground, whereby the first RF switch (M=1) is closest to the test port and the last RF switch (M=N) is closest to the idle port; and
   wherein
      the multitude of the electronic RF switches are sharing the same section of the slabline with the tuning probe of the electro-mechanical tuner.

2. A calibration method for the tuner of claim 1, comprising
   (i) a measurement procedure,
   (ii) a de-embedding procedure, and
   (iii) a cascading procedure,
   wherein
   (i) the measurement procedure comprises the following steps:
      a) connecting the tuner to a pre-calibrated vector network analyzer (VNA);
      b) switching all RF switches to open circuit (OFF);
      c) withdrawing the tuning probe from the slabline;
      d) measuring the tuner s-parameters between the test and idle ports and saving in matrix [S0];
      e) switching the RF switches ON and OFF alternatively, measuring the tuner s-parameter matrices of all $2^N$ RF-switch permutations and saving;
      f) switching all RF switches to OFF;
      g) positioning the tuning probe to a multitude of horizontal (X) and vertical (Y) positions, measuring the tuner s-parameter matrices and saving;
   and wherein
   (ii) the de-embedding procedure comprises
      cascading $[S0]^{-1}$ (the invers of the matrix [S0]) with all $2^N$ s-parameter matrices generated in step e) and saving;
   and wherein
   (iii) the cascading procedure comprises the following steps:
      h) for all horizontal positions X of the tuning probe closer to the test port than the first (M=1) RF switch ($X<X_1$), cascade all tuner s-parameter matrices, generated in step g) with all $2^N$ tuner s-parameter matrices, generated in step (ii);
      j) for all horizontal positions X of the tuning probe closer to the idle port than the last (M=N) RF switch ($X>X_N$), cascade all $2^N$ tuner s-parameter matrices, generated in step (ii) with all tuner s-parameter matrices, generated in step g);
      k) for horizontal positions X of the tuning probe between RF switch M and RF switch M+1 ($X_{M+1}>X\geq X_M$), cascade all s-parameter matrix permutations $2^M$ of the tuner for RF switches 1 to M, generated in step (ii) with the s-parameter matrices of the tuner, for X positions between $X_M$ and $X_{M+1}$ generated in step g), followed by the
      $2^{N-M}$ s-parameter matrix permutations of the tuner for RF switches M+1 to N, generated in step (ii);
      l) save the result of the cascading procedure in a calibration file comprising all permutations of tuner s-parameter matrices of the mechanical tuning probe positions and the electronic tuner RF switch states.

* * * * *